United States Patent
Son (10) Patent No.: US 7,851,887 B2
(45) Date of Patent: Dec. 14, 2010

(54) PHASE CHANGE MEMORY DEVICE WITH HEATER ELECTRODES HAVING FINE CONTACT AREA AND METHOD FOR MANUFACTURING THE SAME

(75) Inventor: Min Seok Son, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/344,777

(22) Filed: Dec. 29, 2008

(65) Prior Publication Data

US 2010/0072450 A1   Mar. 25, 2010

(30) Foreign Application Priority Data

Sep. 19, 2008   (KR) ...................... 10-2008-0092222

(51) Int. Cl.
*H01L 23/58* (2006.01)
(52) U.S. Cl. .................. 257/536; 257/537; 257/538
(58) Field of Classification Search ......... 257/536–538; 365/148
See application file for complete search history.

(56) References Cited

U.S. PATENT DOCUMENTS

2004/0219773 A1* 11/2004 Choi et al. .................. 438/597
2009/0225588 A1*  9/2009 Czubatyj et al. ............. 365/163

FOREIGN PATENT DOCUMENTS

KR         100674144 B1     1/2007

* cited by examiner

*Primary Examiner*—Zandra Smith
*Assistant Examiner*—Paul E Patton
(74) *Attorney, Agent, or Firm*—Ladas & Parry LLP (57) ABSTRACT

A phase change memory device includes a semiconductor substrate having a conductive region, a heater electrode formed on the semiconductor substrate and including a connection element which is composed of carbon nanotubes electrically connected with the conductive region, and a phase change pattern layer contacting the connection element of the heater electrode.

16 Claims, 7 Drawing Sheets

PHASE CHANGE MEMORY DEVICE WITH HEATER ELECTRODES HAVING FINE CONTACT AREA AND METHOD FOR MANUFACTURING THE SAME

CROSS-REFERENCES TO RELATED PATENT APPLICATION

The present application claims priority under 35 U.S.C 119(a) to Korean Application No. 10-2008-0092222, filed on Sep. 19, 2008 in the Korean Intellectual Property Office, which is incorporated herein by reference in its entirety as if set forth in full.

BACKGROUND

The embodiments described herein relate generally to a phase change memory device and a method for manufacturing the same, and more particularly, to a phase change memory device having heater electrodes and a method for manufacturing the same.

A phase change memory device is a memory device in which information is stored using a difference in electrical conductivity or resistance between a crystalline phase and an amorphous phase of a phase change material. In the phase change memory device, memory cells are configured such that they are electrically connected to switching elements, etc. formed on a semiconductor substrate, to implement addressing and read/write driving operations. In the phase change memory information is stored using a difference in conductivity owing to the phase change of a memory layer, therefore data is actually stored in the memory layer including phase change regions.

In a phase change memory cell current flowing through a switching element and the like electrically increases the temperature of a phase change region. The variation in temperature of the phase change regions reversibly converts the structure of a phase change material between the crystalline phase and the amorphous phase to store information. The stored information is read through measuring the resistance of the phase change material by directing a low current to the phase change region.

Currently, in the phase change memory device, reduction in power consumption and reduction in operation current are being explored. In order to achieve reduction in power consumption and reduction in operation current in the phase change memory device, it is necessary increase the level of integration, decrease contact resistance, and increase heat dissipation in the phase change memory device. The level of integration of the phase change memory device may be increased by reducing the area of a switching element for transmitting current to a phase change layer. The contact resistance in the phase change memory device may be reduced by sufficiently securing the contact area between a heater electrode for directly heating the phase change layer and the switching element. Heat dissipation in the phase change memory device may be increased by increasing the resistance of the heater electrode and reducing the contact area between the heater electrode and the phase change layer.

Recently, the area of the switching element has been reduced to some extent and the resistance of the heater electrode has been increased to some extent because the switching element of a phase change memory device is implemented using a PN diode occupying a small area and a heater electrode is made of titanium nitride (TiN) or silicon germanium (SiGe) having great specific resistance.

However, the contact area between the switching element and the heater electrode and the contact area between the heater electrode and the phase change layer are in a trade-off relationship with respect to each other, such that it is difficult to simultaneously reduce the operation current and reduce the power consumption in the phase change memory device.

SUMMARY OF THE INVENTION

According to one aspect of an embodiment of the present invention, there is provided a phase change memory device comprising a semiconductor substrate having a conductive region; a heater electrode formed on the semiconductor substrate and including a connection element which is composed of carbon nanotubes electrically connected with the conductive region; and a phase change pattern layer contacting the connection element of the heater electrode.

According to another aspect of the embodiment, there is provided a method for manufacturing a phase change memory device. In this method, after a semiconductor substrate having a conductive region is prepared, a heater electrode having a connection element, which is composed of carbon nanotubes, is formed on the semiconductor substrate, and a phase change pattern is formed to contact the connection element of the heater electrode.

According to still another aspect of the embodiment, there is provided a phase change memory device comprising a semiconductor substrate; a plurality of heater electrodes formed on the semiconductor substrate and each including a first heater electrode pattern which has a groove defined therein and possesses the shape of a cylinder and a second heater electrode pattern which is formed on a sidewall of the first heater electrode pattern; and a plurality of phase change patterns each contacting the second heater electrode pattern of each heater electrode.

According to a still further aspect of the present invention, there is provided a method for manufacturing a phase change memory device. In this method, a semiconductor substrate is prepared, and a first heater electrode pattern having the shape of a cylinder is formed on the semiconductor substrate. Then, a heater electrode is defined by forming a second heater electrode pattern on a side wall of the first heater electrode pattern to have a line width less than a line width of the first heater electrode pattern. Next, the heater electrode is insulated, and a phase change pattern is formed to contact an upper end of the heater electrode.

BRIEF DESCRIPTION OF THE DRAWINGS

FIG. 1b is a plan view of the heater electrode shown in FIG. 1a.

FIG. 2b is a plan view of the heater electrode shown in FIG. 2a.

DESCRIPTION OF EXEMPLARY EMBODIMENTS

Hereafter, embodiments of the present invention will be described with reference to the accompanying drawings.

Figure 1A:
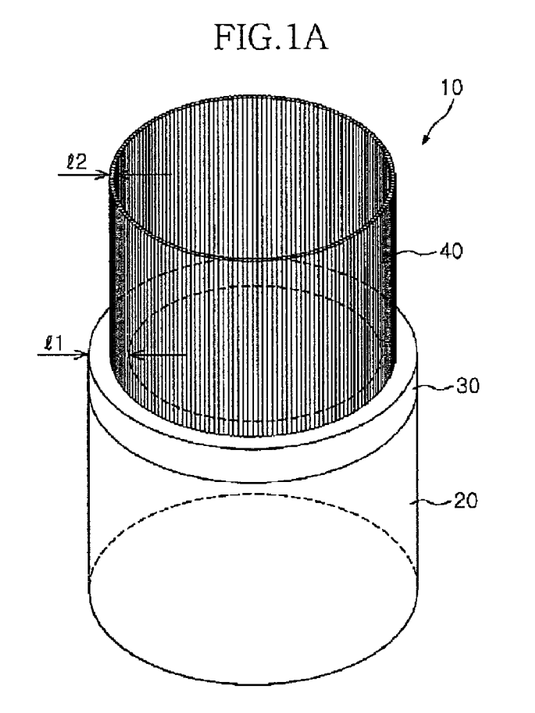
FIG. 1a is a perspective view showing a heater electrode of a phase change memory device in accordance with one embodiment of the present invention.
Figure 1B:
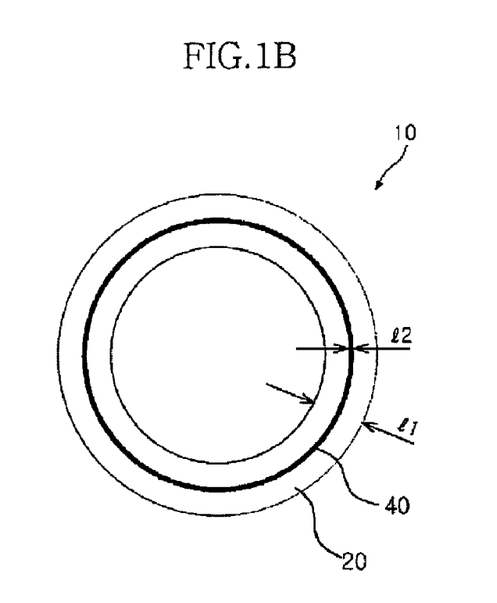

First, referring to FIGS. 1a and 1b, a heater electrode 10 may include a first heater electrode pattern 20 and a second heater electrode pattern 40, which is formed on the first heater electrode pattern 20.

While not shown in the drawings, the first heater electrode pattern 20 can be electrically connected with a conductive member of a semiconductor substrate, for example, a switching element. The first heater electrode pattern 20 can be formed to a minimum diameter obtainable by current lithography equipment, that is, a line width that corresponds to a minimum feature size, i.e., a lithography limit. In the present embodiment, the first heater electrode pattern 20 has the shape of a cylinder, which has a bottom and is opened at the upper end thereof. It should be understood that while a cylindrical shape has been described above, the cylindrical shape is only an example among any number of shapes that are appropriate for the first heater pattern 20. The first heater electrode pattern 20 serves as an electrical medium between the switching element and the second heater electrode pattern 40, and the presence of the bottom of the first heater electrode pattern 20 provides a sufficient contact area between the first heater electrode pattern 20 and the switching element. The first heater electrode pattern 20 may comprise a conductive layer having high specific resistance (in the range of 0.1 to 10 mΩ-cm), the conductive layer may include, for example, any one selected from TiN, TaN, TiAlN, WN, WBN, TiSiN, WSiN, SiGe, and polysilicon layers, or a stack thereof.

The second heater electrode pattern 40 connects the first heater electrode pattern 20 and a phase change pattern (not shown). In the present embodiment, a sectional area of the second heater electrode pattern 40 may be less than that of the first heater electrode pattern 20. When the first heater electrode pattern 20 has the shape of a cylinder, the second heater electrode pattern 40 may also have the shape of a cylinder, which is opened at the upper and lower ends thereof, because the second heater electrode pattern 40 is formed along an upper surface of a sidewall of the first heater electrode pattern 20. Preferably, the second heater electrode pattern 40 is formed such that a line width l2 of the upper surface of the sidewall thereof is less than a line width l1 of the upper surface of the sidewall of the first heater electrode pattern 20. The second heater electrode pattern 40 formed in this manner may comprise bundles of carbon nanotubes each having a diameter of several nanometers. As is well known in the art, the carbon nanotubes provide a contact area on a nanometer level with regard to the phase change pattern, while serving as wires having a conductive property and a diameter of several nanometers.

When the second heater electrode pattern 40 comprises bundles of carbon nanotubes as described above, a catalyst layer 30 must be formed on the first heater electrode pattern 20 so as to selectively grow the carbon nanotubes. The catalyst layer 30 may comprise at least one of nickel (Ni), cobalt (Co), ferrum (Fe), and iridium (Y), and the catalyst layer 30 may be a powder. In the present embodiment, due to the fact that the catalyst layer 30 is formed on the entire upper surface of the sidewall of the first heater electrode pattern 20, the second heater electrode pattern 40 is formed over the first heater electrode pattern 20 which has the catalyst layer 30 formed thereon.

Figure 2A:
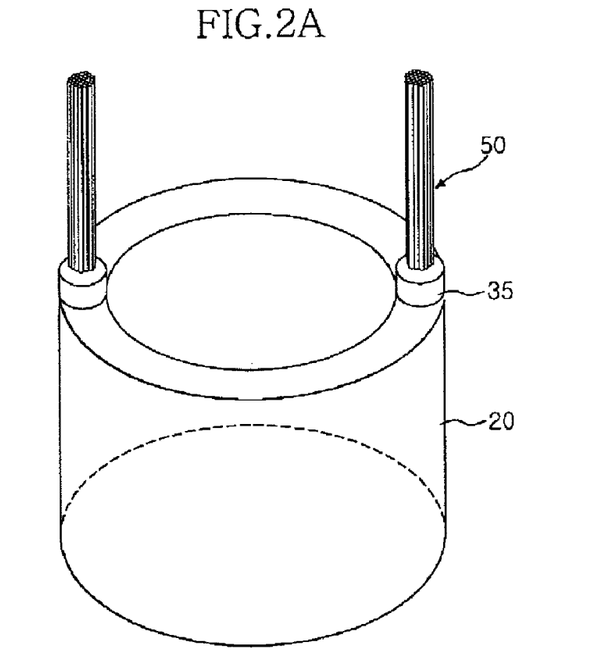
FIG. 2a is a perspective view showing a heater electrode of a phase change memory device in accordance with another embodiment of the present invention.
Figure 2B:
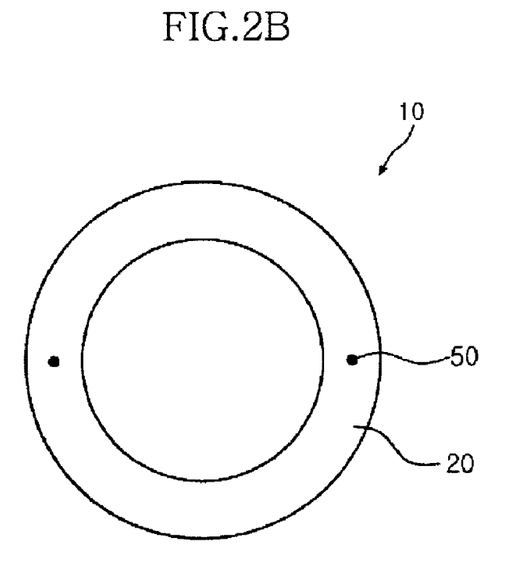

Alternatively, second heater electrode patterns 50 may be arbitrarily located on the first heater electrode pattern 20 as shown in FIGS. 2a and 2b. The second heater electrode patterns 50, which are arbitrarily located, can also comprise bundles of carbon nanotubes grown by using catalyst layers 35 as seeds. Therefore, by changing the positions and the shapes of the catalyst layers 35, the second heater electrode patterns 50, comprising carbon nanotubes, may be changed in their shapes in any number of ways.

As a consequence, in the heater electrode 10 according to the embodiment as shown in FIGS. 1a and 1b, the second heater electrode pattern 40, which has the line width l2 less than the line width l1 of the first heater electrode pattern 20, is formed on the first heater electrode pattern 20 having a diameter no greater than the minimum feature size. Due to this fact, the heater electrode 10 contacts the phase change pattern, which will be subsequently formed, while having a line width no greater than the lithography limit. Moreover, in the heater electrode 10 according to the present embodiment, since the second heater electrode pattern 40, which is to contact the phase change pattern, comprises the carbon nanotubes, each nanotube having a diameter of several nanometers, the contact area can be further reduced when compared to a conventional cylinder-shaped heater electrode. According to this, a reset current for a phase change can be significantly decreased.

Hereinbelow, a method for manufacturing a phase change memory device in accordance with another embodiment will be described with reference to FIGS. 3a through 3d.

Figure 3A:
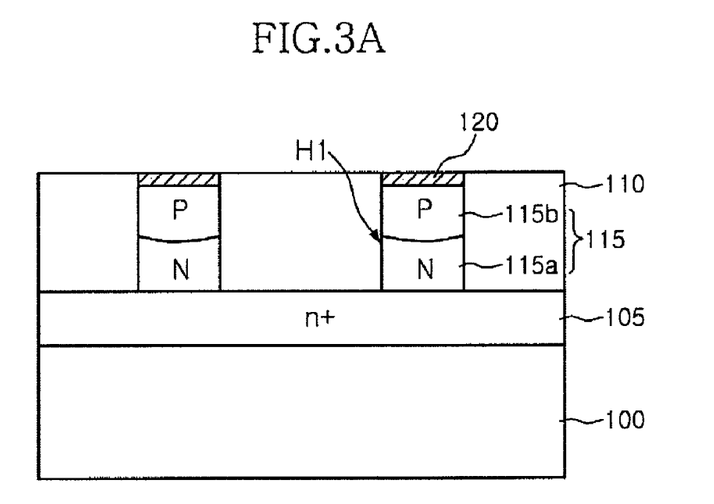
FIGS. 3a through 3d are cross-sectional views shown for illustrating the processes of a method for manufacturing a phase change memory device in accordance with another embodiment.

Referring to FIG. 3a, an impurity region 105 is formed in a semiconductor substrate 100. The impurity region 105 may comprise, for example, N-type impurities. A first interlayer dielectric 110 is formed on the resultant semiconductor substrate 100. First contact holes H1 are defined in the first interlayer dielectric by etching the first interlay dielectric 110 thereby exposing predetermined portions of the impurity region 105. An N-type selective epitaxial growth (SEG) layer 115a is formed through a conventional process to fill the first contact holes H1. Subsequently, a P-type SEG layer 115b is formed by implanting P-type impurities on the N-type SEG layer 115a. According to this, PN diodes 115 are formed in the first interlayer dielectric 110. Next, an ohmic contact layer 120 is selectively formed on the PN diodes 115. The ohmic contact layer 120 may be formed, for example, through the steps of forming a refractory metal layer (not shown) on the first interlayer dielectric 110 formed with the PN diodes 115, forming an ohmic contact layer 120 comprising silicide by annealing the refractory meal layer, and removing the remaining refractory metal layer.

Figure 3B:
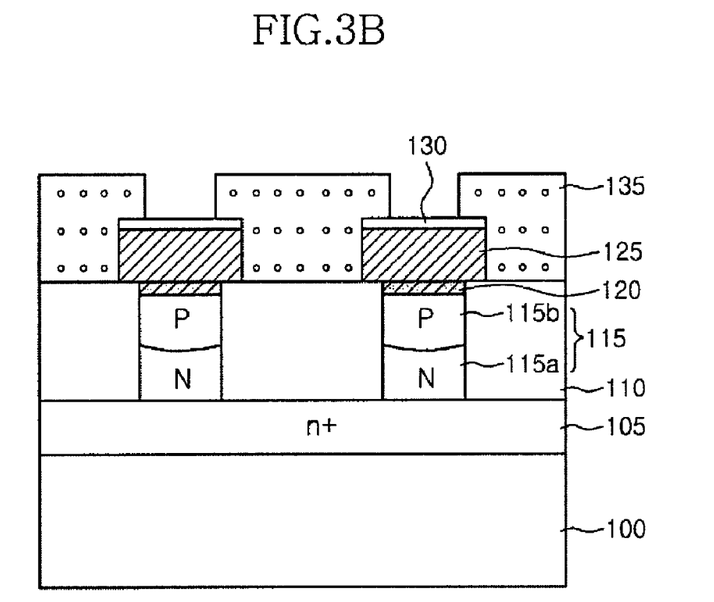

Referring to FIG. 3b, a conductive layer (not shown) and a catalyst layer 130 are deposited on the first interlayer dielectric 110, subsequently first heater electrode patterns 125 are formed to contact the ohmic contact layer 120 by patterning the catalyst layer 130 and the conductive layer. According to the present embodiment, the first heater electrode patterns 125 may comprise a conductive layer having high specific resistance, for example, any one selected from TiN, TaN, TiAlN, WN, WBN, TiSiN, WSiN, SiGe, and polysilicon layers, or a stack thereof. Also, the catalyst layer 130 may comprise at least one of nickel (Ni), cobalt (Co), ferrum (Fe), and iridium (Y), and the catalyst layer 130 can include a metal powder layer formed using at least one of the nickel (Ni), cobalt (Co), ferrum (Fe), and iridium (Y) materials. The first heater electrode patterns 125 may have a line width that is equal to or greater than the diameter (line width) of the PN diodes 115. According to the present embodiment, the first heater electrode patterns 125 can have the shape of conventional patterns as shown in FIG. 3b.

Figure 3C:
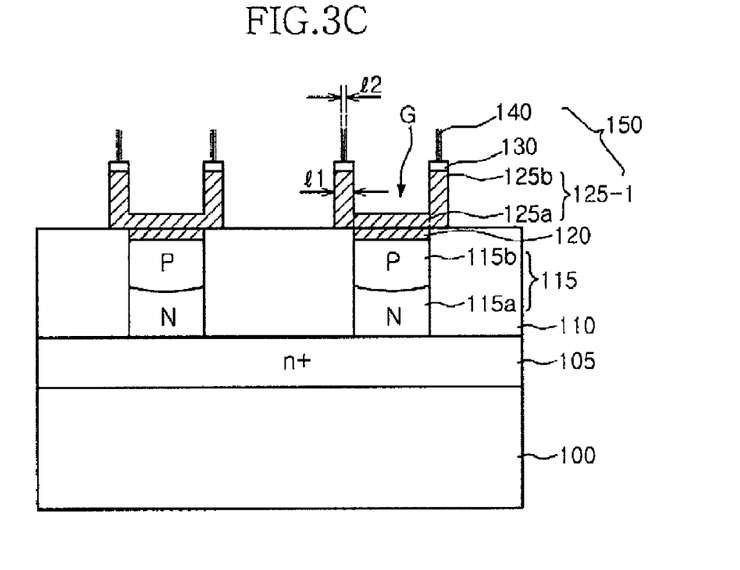

Alternatively, as shown in FIG. 3c, first heater electrode patterns 125-1 may be formed to have the shape of a cylinder. When first heater electrode patterns 125-1 are to be formed in the shape of a cylinder, a mask pattern 135, as shown in FIG. 3b, is formed to expose portions of the upper surfaces of the first heater electrode patterns 125. The mask pattern 135 may be formed to cover portions of the first interlayer dielectric 110 between the first heater electrode patterns 125 and the peripheral portions of the first heater electrode patterns 125. That is, the mask pattern 135 may be formed to cover the first interlayer dielectric 110 and the first heater electrode patterns 125, such that a central portion of the first heater electrode patterns 125 is exposed. The mask pattern 135 may comprise, for example, a photoresist pattern.

Referring to FIG. 3c, grooves G are defined in the first heater electrode patterns 125 by patterning the exposed portions of the conventionally-shaped first heater electrode patterns 125 using the mask pattern 135 as an etch mask. Through this, first heater electrode patterns 125-1 can be formed in the shape of a cylinder, the cylinder having a bottom 125a and a sidewall 125b extending from the peripheral portion of the bottom 125a.

Figure 4:
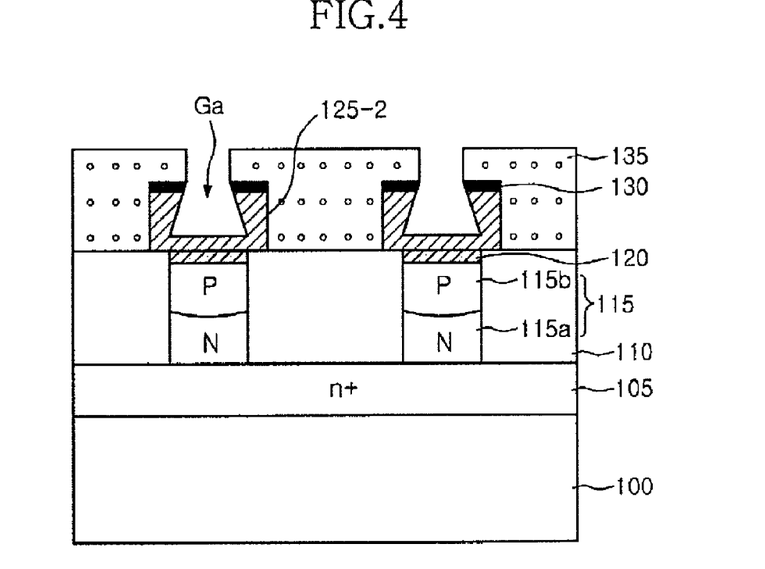
FIGS. 4 through 6 are cross-sectional views showing phase change memory devices in accordance with embodiments of the present invention.
Figure 5:
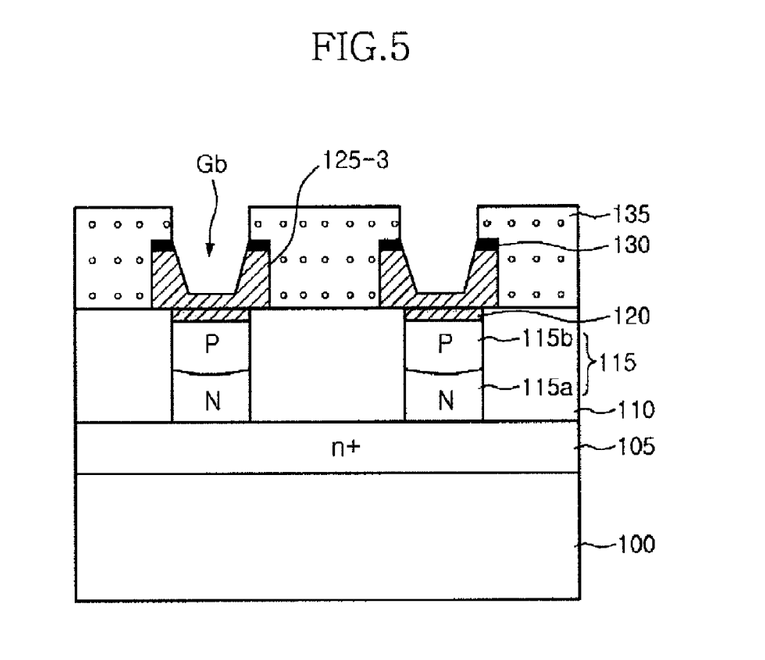
Figure 6:
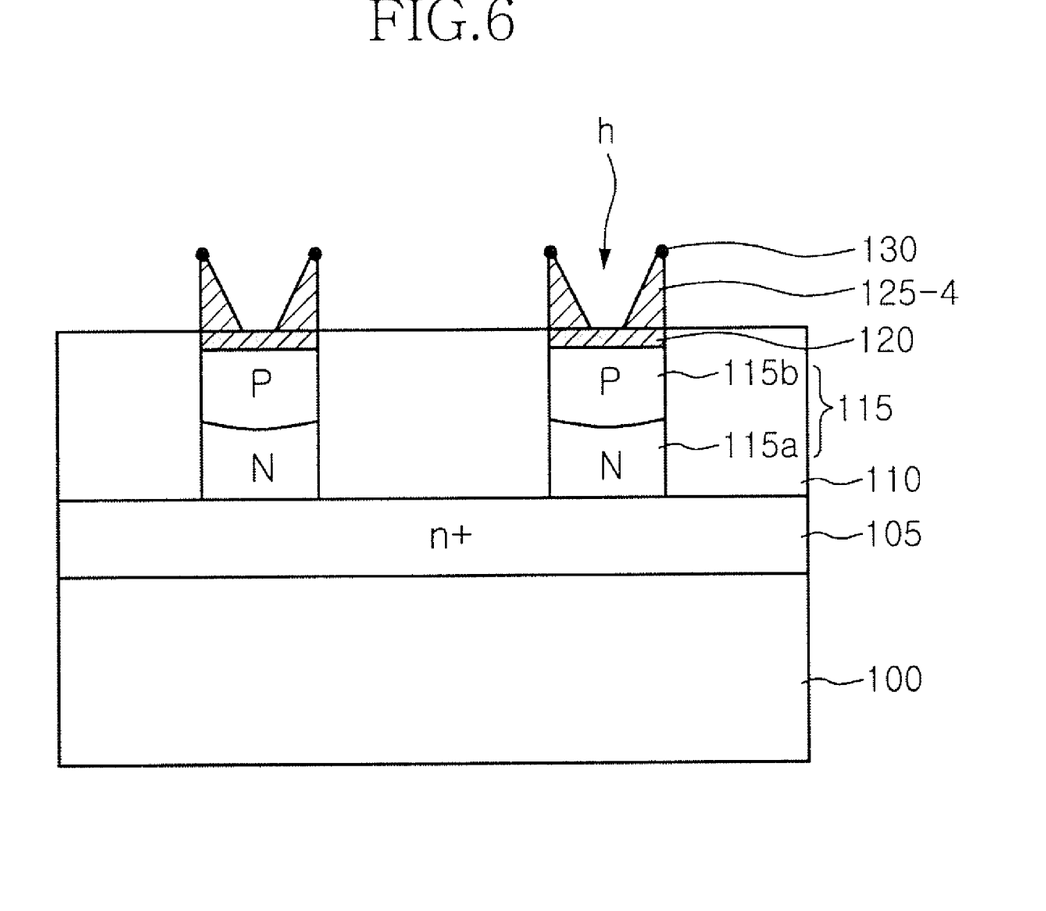

The shape of the first heater electrode patterns 125-1 may be changed depending upon the shape of the grooves G. For example, first heater electrode patterns 125-2 may be formed by defining grooves Ga which have reversely tapered sidewalls (i.e., the width of a groove Ga may increase from the top of the groove Ga to the bottom of the groove Ga such that bottom of the groove Ga is wider than the top of the groove Ga) as shown in FIG. 4, and first heater electrode patterns 125-3 may be formed by defining grooves Gb which have tapered sidewalls (i.e., the width of a groove Gb may decrease from the top of the groove Gb to the bottom of the groove Gb such that the top of the groove Gb is wider than the bottom of the groove Gb) as shown in FIG. 5. Alternatively, holes h, which have tapered sidewalls, can be formed in first heater electrode patterns 125-4 as shown in FIG. 6. In this case, the first heater electrode patterns 125-4 have the shape of a cylinder which is opened at the upper and lower ends thereof, that is, the heater electrode patterns 125-4 do not include bottoms. The shapes of the grooves G, Ga, Gb, and h may be determined depending upon selected etching method and etchant gas.

Referring again to FIG. 3c, second heater electrode patterns 140, comprising carbon nanotubes, are formed on the sidewalls 125b of the first heater electrode patterns 125-1 by using the catalyst layer 130 as a seed, the catalyst layer being positioned on the sidewalls 125b of the first heater electrode patterns 125-1, which have the shape of a cylinder. As is well known in the art, the carbon nanotubes are formed as wires each of which has a diameter of several nanometers and is oriented in the vertical direction, and can be formed through, for example, any one of arc-discharge, laser vaporization, plasma-enhanced chemical vapor deposition, thermal chemical vapor deposition, vapor phase growth, electrolysis, and flame synthesis. The carbon nanotubes are grown on the sidewalls 125b in bundles, the line width of the bundles may not be greater than the line width of the sidewalls 125b. The bonds between molecules of the carbon nanotubes can relatively easily break because the carbon nanotubes have a large number of n-bonds between the molecules thereof. Therefore, since a large amount of free electrons can be generated, as is well known in the art, the carbon nanotubes can have excellent conductivity. As a consequence, heater electrodes 150 are formed on the semiconductor substrate 100, the heater electrodes 150 are composed of the first heater electrode patterns 125-1, the catalyst layer 130, and the second heater electrode patterns 125-2, comprising carbon nanotubes.

When the first heater electrode patterns 125 are formed having the conventionally patterned structure, an additional process for changing the shape of the catalyst layer 130 should be conducted. That is, when the first heater electrode patterns 125 are formed having the conventionally patterned structure a additional process for etching the catalyst layer 130 is conducted to allow the catalyst layer 130 to be located on the peripheral portions of the first heater electrode patterns 125, or alternatively, as arbitrarily placed patterns, such that the line width of second heater electrode patterns is no greater than the line width of the first heater electrode patterns 125.

Figure 3D:
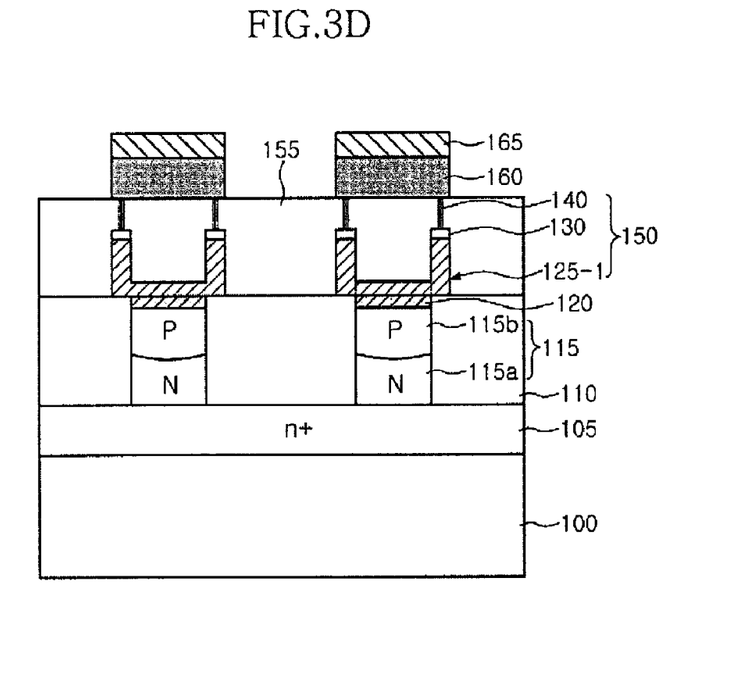

Referring to FIG. 3d, a second interlayer dielectric 155 is formed on the resultant semiconductor substrate 100, which is formed with the heater electrodes 150 including the carbon nanotubes. In order to thermally insulate the heater electrodes 150 from each other, the second interlayer dielectric 155 may comprise a silicon nitride layer having excellent thermal resistance. Subsequently, the second interlayer dielectric 155 is planarized until the upper surfaces of the heater electrodes 150 are exposed, that is, the upper surfaces of the second heater electrode patterns 140 comprising the carbon nanotubes are exposed. Here, the planarization may be conducted through chemical mechanical polishing (CMP) or other suitable process.

Thereafter, a phase change material layer (not shown) is deposited on the planarized second interlayer dielectric 155. The phase change material layer may be formed of a chalcogenide compound containing germanium (Ge), stibium (Sb) and tellurium (Te). However, the present invention is not limited to such a material as discussed in the above embodiment, that is, the phase change material may be formed of any suitable material so long as the resistance thereof is changed by application of heat. A top electrode layer (not shown) is formed on the phase change material layer. The top electrode layer may include a conductive layer or a metal nitride layer, which also constitutes the first heater electrode patterns 125-1. Thereupon, by patterning the phase change material layer and the top electrode layer, in correspondence with the respective heater electrodes 150, top electrodes 165 and phase change patterns 160 are formed.

In the present embodiment, due to the fact that portions of the heater electrodes 150 which contact the phase change patterns 160 comprise carbon nanotubes having excellent conductivity and a fine diameter, the contact area between the phase change patterns 160 and the heater electrodes 150 can be significantly reduced. Moreover, since the carbon nanotubes are formed on the peripheral portions of the heater electrodes 150 in the form of a ring or, alternatively, arbitrarily placed patterns, the diameter of the portions of the heater electrodes 150 which contact the phase change patterns 160 is no greater than a minimum feature size i.e., a lithography limit, whereby reset current can be significantly decreased.

Figure 7A:
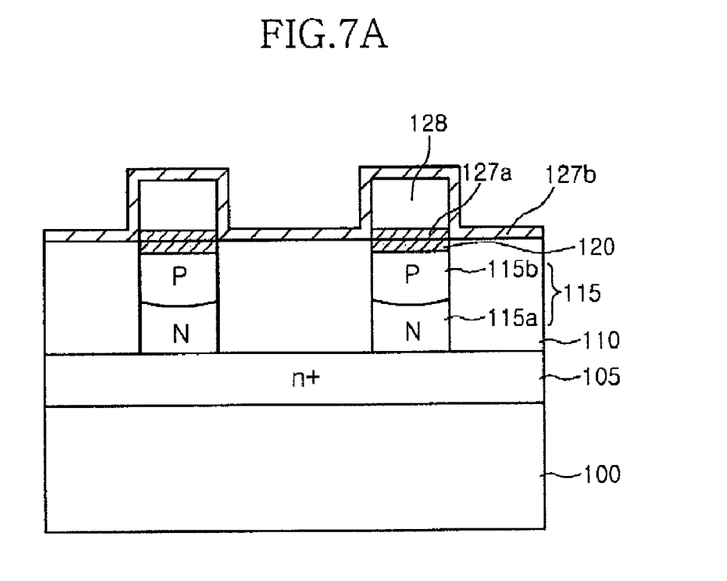
FIGS. 7a and 7b are cross-sectional views shown for illustrating the processes of a method for manufacturing a phase change memory device in accordance with still another embodiment.
Figure 7B:
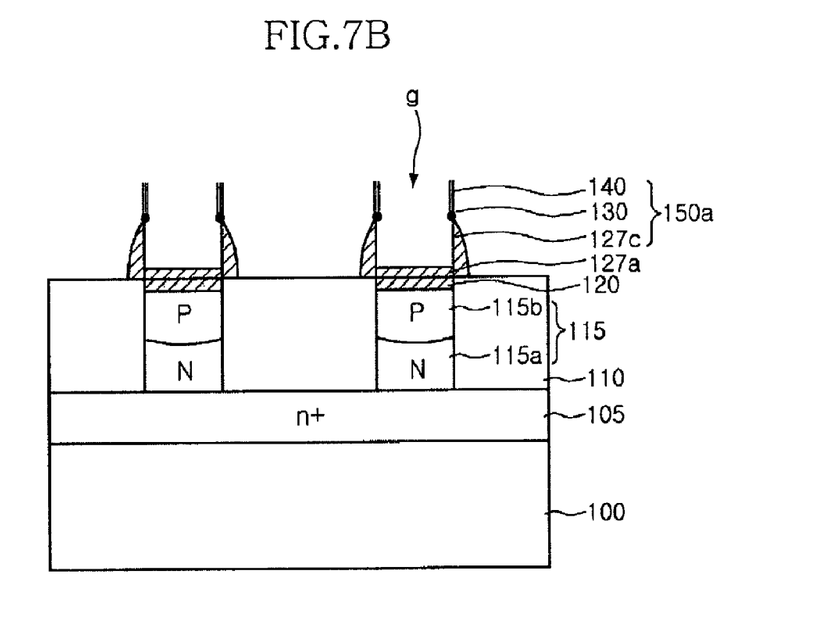

FIGS. 7a and 7b are cross-sectional views shown for illustrating the processes of a method for manufacturing a phase change memory device in accordance with still another embodiment. In the present embodiment, the processes are the same as those of the aforementioned embodiment until the forming of the ohmic contact layer 120, and therefore, only the processes after forming the ohmic contact layer 120 will be described below.

First, referring to FIG. 7a, a first conductive layer and a sacrificial layer for heater electrodes are sequentially formed on the ohmic contact layer 120. Then, sacrificial patterns 128 and first heater electrode patterns 127a are formed by patterning the sacrificial layer and the first conductive layer. The first heater electrode patterns 127a contact the ohmic contact layer 120, and the line width thereof may be less or greater than the line width of the ohmic contact layer 120. Next, a second conductive layer 127b for heater electrodes is formed on the resultant semiconductor substrate 100 to a predetermined thickness.

Thereafter, as shown in FIG. 7b, spacers 127c are formed on the sidewalls of the first heater electrode patterns 127a and the sacrificial patterns 128 by anisotropically etching the second conductive layer 127b until the surfaces of the sacrificial patterns 128 are exposed. As a result of the anisotropic etching, an upper ends of a spacers 127c has a pointed shape. Thereupon, a catalyst layer 130 is formed selectively onto the upper surfaces of the spacers 127c. At this time, since the catalyst layer 130 is formed on the spacers 127c, which have pointed upper ends, the line width of the catalyst layer 130 can further be decreased when compared to the aforementioned embodiments.

Subsequently, the sacrificial patterns 128 are removed, and carbon nanotubes are grown on the catalyst layer 130 using the catalyst layer 130 as a seed so as to form second heater electrode patterns 140. As a result of the above processes, heater electrodes 150a are formed on the semiconductor substrate 100.

In the present embodiment, it is possible to grow carbon nanotubes a finer line width because the catalyst layer 130 is formed on the pointed spacers 127c.

As is apparent from the above description, in the present invention, carbon nanotubes having a diameter in the range of several nanometers are grown on a peripheral portion of a heater electrode. Accordingly, the contact area between a switching element and a heater electrode can be sufficiently secured, and the contact area between the heater electrode and a phase change pattern can be reduced according to the current limits in lithography methods, whereby a reset current can be significantly decreased.

It is to be noted that the present invention is not limited to the aforementioned embodiments. For example, while it was described in the above embodiments that the second heater electrode patterns comprise carbon nanotubes, the present invention is not limited to such, and instead, conductive wires having a nanometer line width may be adopted to constitute the second heater electrode patterns.

Although exemplary embodiments of the present invention have been described for illustrative purposes, those skilled in the art will appreciate that various modifications, additions, and substitutions are possible, without departing from the scope and the spirit of the invention as disclosed in the accompanying claims.

What is claimed is:

1. A phase change memory device comprising:
a semiconductor substrate having a conductive region;
a heater electrode formed on the semiconductor substrate and electrically connected with the conductive region, the heater electrode comprising a connection element composed of carbon nanotubes electrically connected with the conductive region, and a conductive pattern supporting the connection element; and
a phase change pattern layer formed on the connection element of the heater electrode, wherein the connection element comprises bundles of carbon nanotubes and a line width of the connection element is less than a line width of the conductive pattern.

2. The phase change memory device according to claim 1, wherein the connection element is formed in the shape of a cylinder.

3. The phase change memory device according to claim 1, wherein the connection element is formed on the conductive pattern.

4. The phase change memory device according to claim 1, wherein the conductive pattern has a line width corresponding to a minimum feature size.

5. The phase change memory device according to claim 1, wherein a groove is defined in the conductive pattern such that the conductive pattern has the shape of a cylinder, and wherein the connection element is formed on an upper surface of a sidewall of the conductive pattern that defines the groove.

6. The phase change memory device according to claim 1, wherein a catalyst layer is interposed between the conductive pattern and the connection element.

7. The phase change memory device according to claim 5, wherein the catalyst layer is formed of any one selected from nickel (Ni), cobalt (Co), ferrum (Fe), and iridium (Y).

8. A phase change memory device comprising:
a semiconductor substrate;
a plurality of heater electrodes formed on the semiconductor substrate, each heater electrode of the plurality of heater electrodes comprising:
a first heater electrode pattern having a groove defined therein and having the shape of a cylinder; and
a second heater electrode pattern formed on a sidewall defining the groove of the first heater electrode pattern; and
a plurality of phase change patterns, each formed on a second heater electrode pattern of a heater electrode, wherein an outer surface of the sidewall of the first heater electrode pattern has a tapered shape.

9. The phase change memory device according to claim 8, wherein a line width of the second heater electrode pattern is less than a line width of the first heater electrode pattern.

10. The phase change memory device according to claim 8, wherein the second heater electrode pattern comprises bundles of carbon nanotubes and a line width of the second heater electrode pattern is less than a line width of the first heater electrode pattern.

11. The phase change memory device according to claim 10, wherein a catalyst layer is interposed between the second heater electrode pattern and the first heater electrode pattern.

12. The phase change memory device according to claim 11, wherein the catalyst layer is formed of at least one selected from nickel (Ni), cobalt (Co), ferrum (Fe), and iridium (Y).

13. The phase change memory device according to claim 10, wherein the second heater electrode pattern is formed in the shape of a cylinder along an upper surface of the sidewall of the first heater electrode pattern.

14. The phase change memory device according to claim 10, wherein the second heater electrode pattern is formed on a portion of the sidewall of the first heater electrode pattern.

15. The phase change memory device according to claim 8, wherein an insulation layer is formed on the semiconductor substrate and the plurality of heater electrodes formed thereon so as to fill in grooves of the first heater electrode patterns.

16. The phase change memory device according to claim 8, wherein an inner surface of the first heater electrode pattern is tapered or reversely tapered.

* * * * *